United States Patent
Ching et al.

(10) Patent No.: US 9,929,269 B2
(45) Date of Patent: Mar. 27, 2018

(54) FINFET HAVING AN OXIDE REGION IN THE SOURCE/DRAIN REGION

(71) Applicant: Taiwan Semiconductor Manufacturing Company, Ltd., Hsin-Chu (TW)

(72) Inventors: Kuo-Cheng Ching, Zhubei (TW); Chih-Hao Wang, Baoshan Township (TW); Ching-Wei Tsai, Hsin-Chu (TW); Zhiqiang Wu, Chubei (TW); Jean-Pierre Colinge, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/282,539

(22) Filed: Sep. 30, 2016

(65) Prior Publication Data

US 2017/0025537 A1    Jan. 26, 2017

Related U.S. Application Data

(62) Division of application No. 13/970,295, filed on Aug. 19, 2013, now Pat. No. 9,490,348.

(51) Int. Cl.
*H01L 29/78* (2006.01)
*H01L 21/02* (2006.01)
(Continued)

(52) U.S. Cl.
CPC ...... H01L 29/7848 (2013.01); H01L 21/0262 (2013.01); H01L 21/02107 (2013.01);
(Continued)

(58) Field of Classification Search
CPC ............ H01L 29/7843; H01L 29/7846; H01L 29/7848; H01L 21/02107; H01L 21/02123;
(Continued)

(56) References Cited

U.S. PATENT DOCUMENTS 6,198,142 B1   3/2001   Chau et al.
7,525,160 B2   4/2009   Kavalieros et al.
(Continued)

FOREIGN PATENT DOCUMENTS

KR   1020050087541 A   8/2005
KR   20110111550 A    10/2011
KR   20130036694 A     4/2013

*Primary Examiner* — Matthew Landau
*Assistant Examiner* — Mark Hatzilambrou
(74) *Attorney, Agent, or Firm* — Slater Matsil, LLP

(57) ABSTRACT

Embodiments of the present disclosure include a semiconductor device, a FinFET device, and methods for forming the same. An embodiment is a semiconductor device including a first semiconductor fin extending above a substrate, the first semiconductor fin having a first lattice constant, an isolation region surrounding the first semiconductor fin, and a first source/drain region in the first semiconductor fin, the first source/drain having a second lattice constant different from the first lattice constant. The semiconductor device further includes a first oxide region along a bottom surface of the first source/drain region, the first oxide region extending into the isolation region.

20 Claims, 12 Drawing Sheets

(51) Int. Cl.
| | |
|---|---|
| *H01L 27/12* | (2006.01) |
| *H01L 29/06* | (2006.01) |
| *H01L 29/66* | (2006.01) |
| *H01L 21/3065* | (2006.01) |
| *H01L 21/308* | (2006.01) |
| *H01L 21/762* | (2006.01) |
| *H01L 29/165* | (2006.01) |
| *H01L 21/8234* | (2006.01) |
| *H01L 21/84* | (2006.01) |
| *H01L 27/088* | (2006.01) |
| *H01L 29/08* | (2006.01) |
| *H01L 21/28* | (2006.01) |

(52) U.S. Cl.
CPC .. *H01L 21/02123* (2013.01); *H01L 21/02175* (2013.01); *H01L 21/02233* (2013.01); *H01L 21/02274* (2013.01); *H01L 21/02282* (2013.01); *H01L 21/28238* (2013.01); *H01L 21/308* (2013.01); *H01L 21/3065* (2013.01); *H01L 21/76224* (2013.01); *H01L 21/823431* (2013.01); *H01L 21/823437* (2013.01); *H01L 21/823481* (2013.01); *H01L 21/845* (2013.01); *H01L 27/0886* (2013.01); *H01L 27/1211* (2013.01); *H01L 29/0649* (2013.01); *H01L 29/0653* (2013.01); *H01L 29/0847* (2013.01); *H01L 29/165* (2013.01); *H01L 29/6681* (2013.01); *H01L 29/66545* (2013.01); *H01L 29/66795* (2013.01); *H01L 29/785* (2013.01); *H01L 29/7843* (2013.01); *H01L 29/7846* (2013.01); *H01L 29/7851* (2013.01); *H01L 29/7856* (2013.01)

(58) Field of Classification Search
CPC ........... H01L 21/02233; H01L 29/0653; H01L 29/0649
See application file for complete search history.

(56) References Cited

U.S. PATENT DOCUMENTS

| | | | |
|---|---|---|---|
| 8,723,272 | B2 | 5/2014 | Liu et al. |
| 2007/0145487 | A1 | 6/2007 | Kavalieros et al. |
| 2009/0152589 | A1 | 6/2009 | Rakshit et al. |
| 2009/0166761 | A1* | 7/2009 | Curatola ............. H01L 29/0653 257/408 |
| 2010/0038687 | A1 | 2/2010 | Klaus et al. |
| 2011/0127610 | A1* | 6/2011 | Lee ................. H01L 21/823431 257/365 |
| 2012/0104472 | A1* | 5/2012 | Xu .................... H01L 29/66795 257/288 |
| 2012/0280211 | A1 | 11/2012 | Cohen et al. |

* cited by examiner

FINFET HAVING AN OXIDE REGION IN THE SOURCE/DRAIN REGION

CROSS REFERENCE TO RELATED APPLICATION

This application is a divisional of U.S. patent application Ser. No. 13/970,295 entitled "Method of Forming a FinFET Having an Oxide Region in the Source/Drain Region," filed on Aug. 19, 2013, which application is related to U.S. patent application Ser. No. 13/934,992, filed on Jul. 3, 2013, entitled "Fin Structure of Semiconductor Device," now U.S. Pat. No. 9,006,786 issued on Apr. 14, 2015, and commonly assigned to the assignee of the present application, which applications are hereby incorporated by reference herein.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (FinFETs) have been studied to overcome some of these problems.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Fin Field-Effect Transistors (FinFETs) and methods of forming the same are provided in accordance with various embodiments. The intermediate stages of forming the FinFETs are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein.

Figure 1:
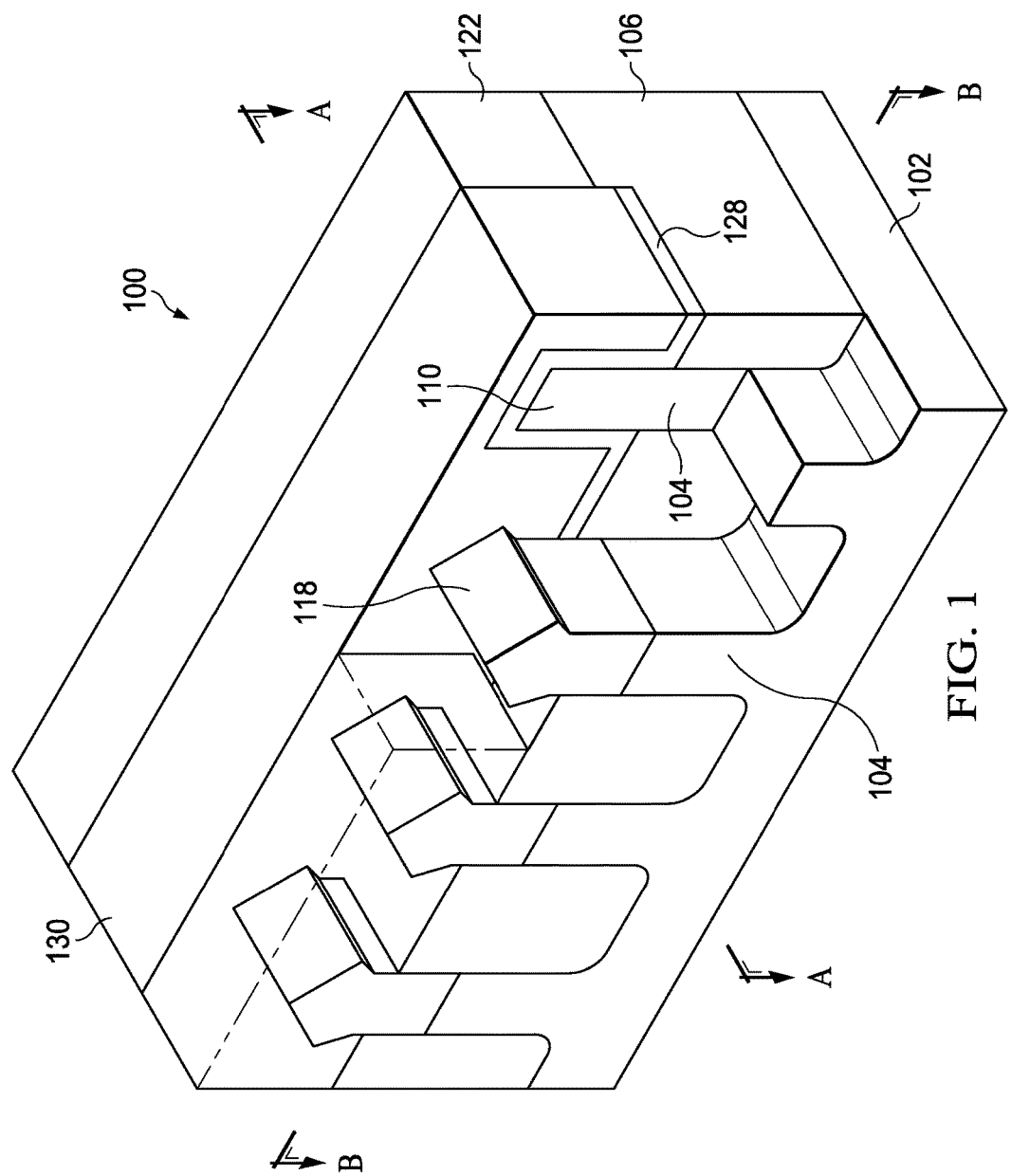
FIG. 1 illustrates a fin field-effect transistor (FinFET) in a three-dimensional view in accordance with an embodiment.

FIG. 1 illustrates a FinFET 100 in a three-dimensional view. The FinFET 100 comprises semiconductor strips 104 on a semiconductor substrate 102. Isolation regions 106 are adjacent and between the semiconductor strips 104. The portions of the semiconductor strips 104 which extend above the top surface of the isolation regions 106 are referred to as semiconductor fins 108 (see FIG. 2B). A gate dielectric 128 is along sidewalls and over a top surface of the semiconductor fins 108, and a gate electrode 130 is over the gate dielectric 128. The portion of the semiconductor fins 108 under the gate electrode 130 is a channel region 110. Source/drain regions 118 are disposed in opposite sides of the semiconductor fins 108 and semiconductor strips 104 with respect to the channel region 110. An inter-layer dielectric (ILD) 122 is over the semiconductor fins 108 and the source/drain regions 118 adjacent the gate electrode 130. FIG. 1 further illustrates reference cross-sections that are used in later figures. Cross-section A-A is along a longitudinal axis of a semiconductor fin 108 and in a direction of, for example, a current flow between the source/drain regions 118. Cross-section B-B is perpendicular to cross-section A-A and is across source/drains 118, the semiconductor fins 108, the semiconductor strip 104, the isolation regions 106, and the ILD 122.

Figure 9A:
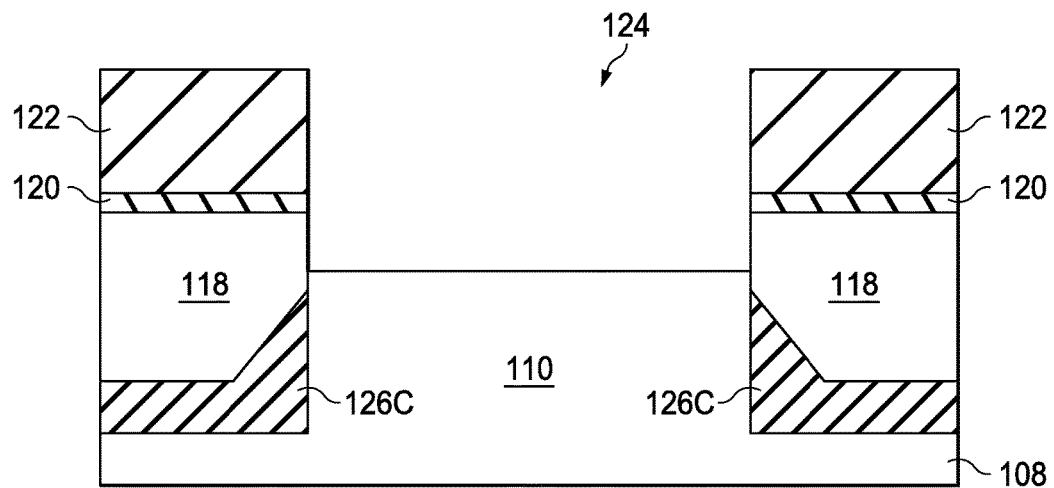
Figure 9B:
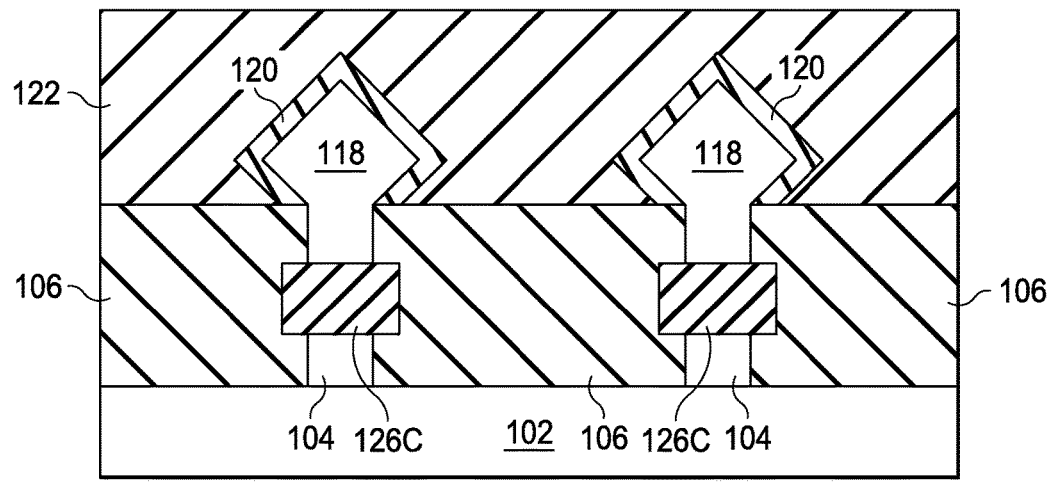
Figure 10A:
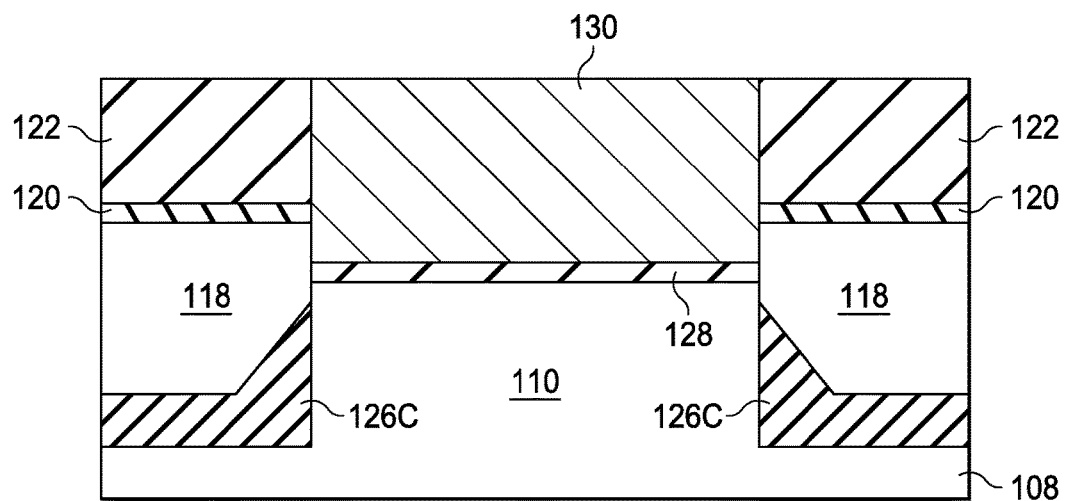
Figure 10B:
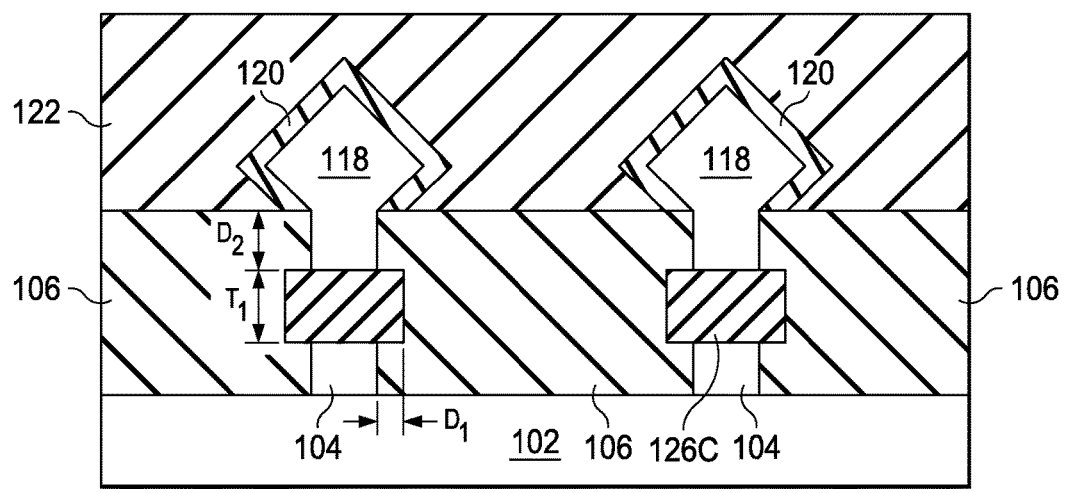
Figure 11:
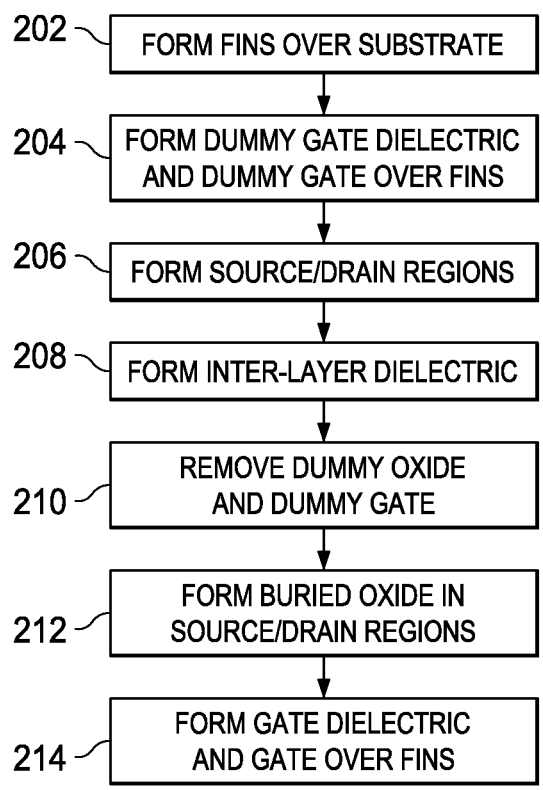
FIG. 11 is a process flow of the process shown in FIGS. 2A through 10B in accordance with an embodiment.

FIGS. 2A through 10B are cross-sectional views of intermediate stages in the manufacturing of a FinFET in accordance with an embodiment, and FIG. 11 is a process flow of the process shown in FIGS. 2A through 10B. FIGS. 2A through 10B illustrate cross-sections A-A and B-B illustrated in FIG. 1, except for a FinFET with two semiconductor fins 108 instead of the four semiconductor fins 108 illustrated in FIG. 1. In FIGS. 2A through 10B, figures ending with an "A" designation are illustrated along a similar cross-section A-A, and figures ending with a "B" designation are illustrated along a similar cross-section B-B.

Figure 2A:
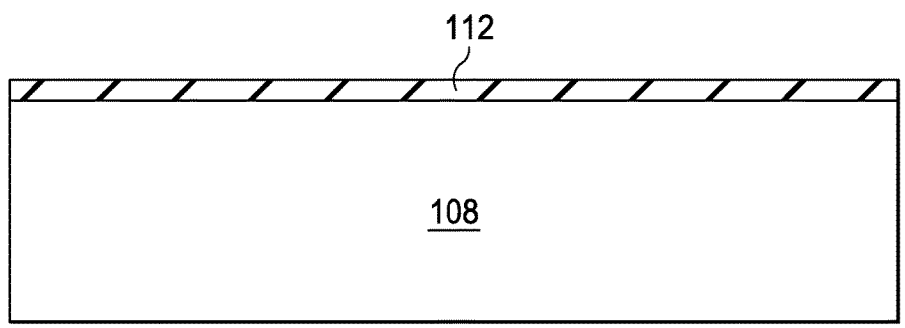
FIGS. 2A, 2B, 3A, 3B, 4A, 4B, 5A, 5B, 6A, 6B, 7A, 7B, 8A, 8B, 9A, 9B, 10A, and 10B are cross-sectional views of intermediate stages in the manufacturing of the FinFET in FIG. 1 in accordance with an embodiment.
Figure 2B:
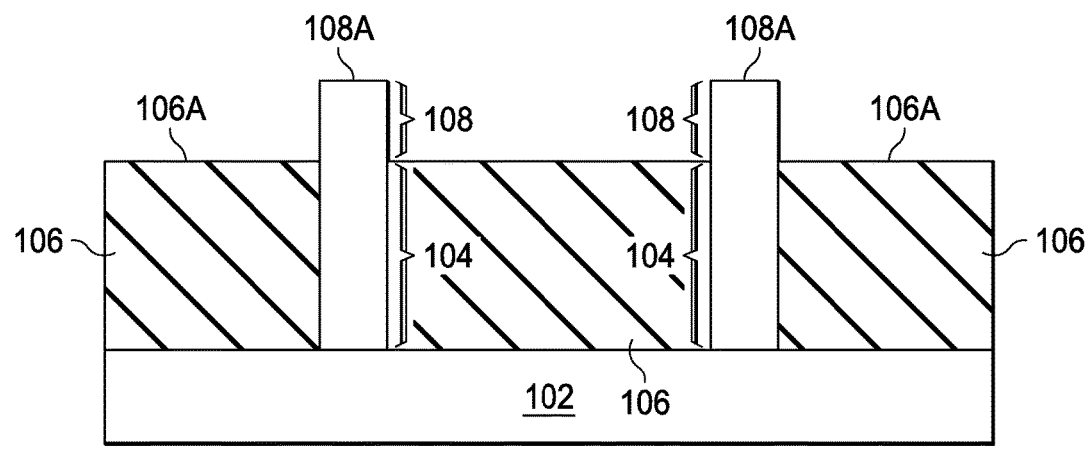

FIG. 2B illustrates a semiconductor substrate 102, which may be a part of a wafer. In some embodiments, the semiconductor substrate 102 is made of a semiconductor material such as silicon, germanium, diamond, or the like. In other embodiments, the semiconductor substrate 102 is made of compound materials such as silicon germanium, silicon carbide, gallium arsenic, indium arsenide, indium phosphide, silicon germanium carbide, gallium arsenic phosphide, gallium indium phosphide, the like, or a combination thereof. In an embodiment, the semiconductor substrate 102 is a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. In some embodiments, the semiconductor substrate 102 is doped with a p-type dopant, such as boron, aluminum, gallium, or the like, although the substrate may alternatively be doped with an n-type dopant, as is known in the art.

In some embodiments, the semiconductor substrate 102 includes active and passive devices (not shown in FIG. 2B). As one of ordinary skill in the art will recognize, a wide variety of devices such as transistors, capacitors, resistors, combinations of these, and the like may be used to generate the structural and functional requirements of the design for the FinFET. The devices may be formed using any suitable methods. Only a portion of the semiconductor substrate 102 is illustrated in the figures, as this is sufficient to fully describe the illustrative embodiments.

In an embodiment, the semiconductor strips 104 are formed by patterning the semiconductor substrate 102. The patterning process may be accomplished by depositing mask material (not shown) such as photoresist or silicon oxide over the semiconductor substrate 102. The mask material is then patterned and the semiconductor substrate 102 is etched in accordance with the pattern. The resulting structure includes a plurality of semiconductor strips 104 formed on the semiconductor substrate 102. Each of the plurality of semiconductor strips 104 has a sidewall being substantially orthogonal to a top surface of the semiconductor substrate 102. In another embodiment, the semiconductor strips 104 may be epitaxially grown from a top surface of the semiconductor substrate 102 within trenches or openings formed in a patterned layer (e.g. the isolation regions 106) atop the semiconductor substrate 102. Because the process is known in the art, the details are not repeated herein.

The semiconductor strips 104 may be formed of semiconductor material such as silicon, germanium, silicon germanium, or the like. In an embodiment, the semiconductor strips 104 are silicon. The semiconductor strips 104 may then doped through an implantation process to introduce p-type or n-type impurities into the semiconductor strips 104.

The isolation regions 106 are blanket deposited on the semiconductor substrate 102 and, in some embodiments, over the semiconductor strips 104. The isolation regions 106 are made of one or more suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation regions 106 are deposited through a process such as chemical vapor deposition (CVD), or a spin-on-glass process, although any acceptable process may be utilized. In an embodiment, the isolation regions 106 are initially formed to have a top surface 106A higher than top surfaces 108A of the semiconductor fins 108.

Next, the isolation regions 106 may be thinned to expose portions of the semiconductor strips 104 to define semiconductor fins 108 (step 202) extending above the top surfaces 106A of the isolation regions 106. The isolation regions 106 may be thinned back in a variety of ways. In one embodiment, this is a multi-step process with the first step involving a chemical mechanical polishing (CMP), in which the isolation regions 106 are reacted and then ground away using an abrasive. This process may continue until the tops of the semiconductor strips 104 are exposed. The next step of thinning the isolation regions 106 below the tops of the semiconductor strips 104 to form the semiconductor fins 108 may be performed in a variety of ways. One such way is by a diluted hydrofluoric acid (DHF) treatment or a vapor hydrofluoric acid (VHF) treatment for a suitable time. In another embodiment, the CMP process step is skipped and the isolation regions 106 are selectively thinned back without removing the semiconductor strips 104. This selective thinning may be performed by the DHF treatment or the VHF treatment described above. In some embodiments, the isolation regions 106 are thinned to a specific depth, meaning the semiconductor fins 108 are formed to a height. In an embodiment, the semiconductor fins 108 have a height from the top surface 106A of the isolation regions 106 to the top surfaces 108A of the semiconductor fins 108 from about 1 nm to about 500 nm.

FIG. 2A illustrates the formation of a dummy gate dielectric layer 112 over the semiconductor fins 108 (step 404). The dummy gate dielectric layer 112 may be formed over the semiconductor fins 108 by thermal oxidation, CVD, a spin-on-glass process, sputtering, or any other methods known and used in the art for forming a dummy gate dielectric. In some embodiments, the dummy gate dielectric layer 112 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate dielectric layer 112 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

Figure 3A:
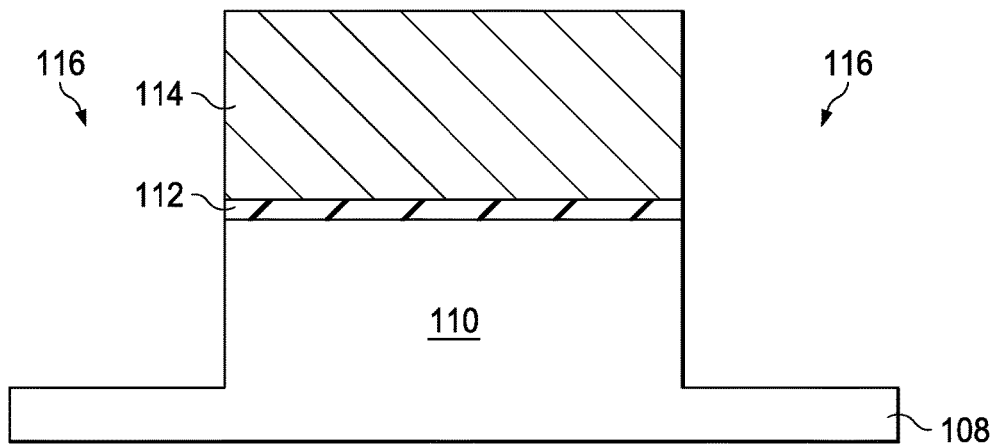
Figure 3B:
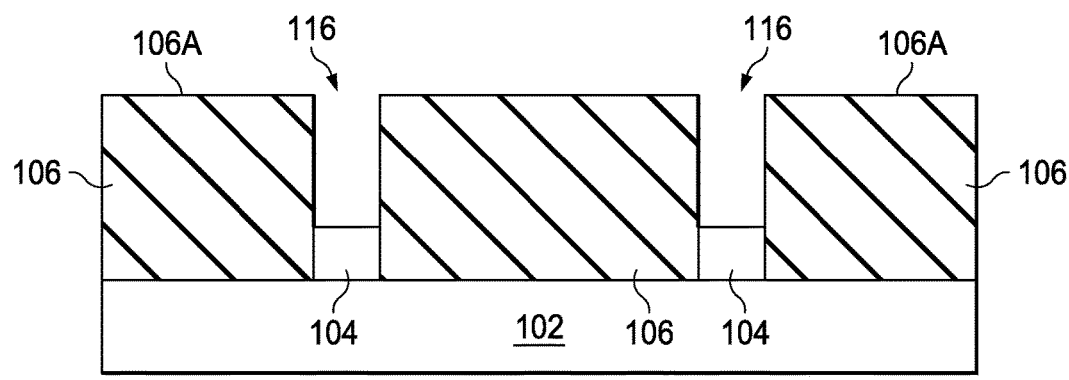

FIGS. 3A and 3B illustrate the formation of a dummy gate electrode 114 on the dummy gate dielectric layer 112 (step 204) and the formation of recesses 116 in the semiconductor fins 108. A dummy gate electrode layer (not shown) is formed over the dummy gate dielectric layer 112. In an embodiment, the dummy gate electrode layer is a conductive material and may be selected from a group comprising polycrystalline-silicon (poly-Si), polycrystalline silicon-germanium (poly-SiGe), metallic nitrides, metallic silicides, metallic oxides, and metals. In an embodiment, the dummy gate electrode layer may be deposited by physical vapor deposition (PVD), CVD, sputter deposition, or other techniques known and used in the art for depositing conductive materials. The top surface of the dummy gate electrode layer usually has a non-planar top surface and may be planarized after it is deposited. The gate electrode layer and the gate dielectric layer 112 may be patterned to form the dummy gate electrode 114 over the dummy gate dielectric layer 112. The gate patterning process may be accomplished by depositing mask material (not shown) such as photoresist or silicon oxide over the dummy gate electrode layer. The mask material is then patterned and the dummy gate electrode layer is etched in accordance with the pattern.

After the patterning of the dummy gate electrode 114, an etching step may be performed on portions of the semiconductor fins 108 in a strained source/drain (SSD) etch step to form the recesses 116 in the semiconductor fins 108. The recesses 116 are formed using the dummy gate electrode 114 as a pattern, and thus, the channel region 110 of the semiconductor fin 108 is between the recesses 116. The SSD etch may selectively etch the semiconductor fins 108 without etching the isolation regions 106 or the dummy gate electrode 114. The SSD etch step may performed in a variety of ways. In an embodiment, the SSD etch step may be performed by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like and the etchant gas may be fluorine, chlorine, bromine, combinations thereof, or the like. In another embodiment, the SSD etch step may be performed by a wet chemical etch, such as ammonium peroxide mixture (APM), $NH_4OH$, TMAH, combinations thereof, or the like. In yet another embodiment, the SSD etch step may be performed by a combination of a dry chemical etch and a wet chemical etch.

Figure 4A:
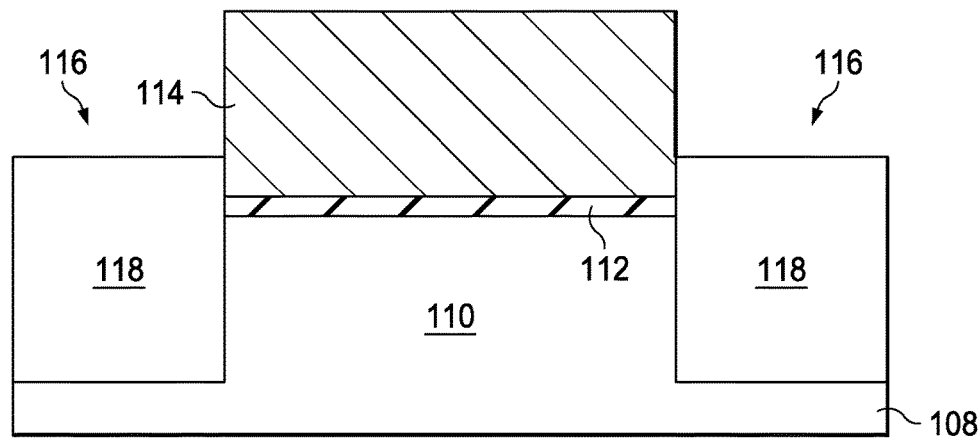
Figure 4B:
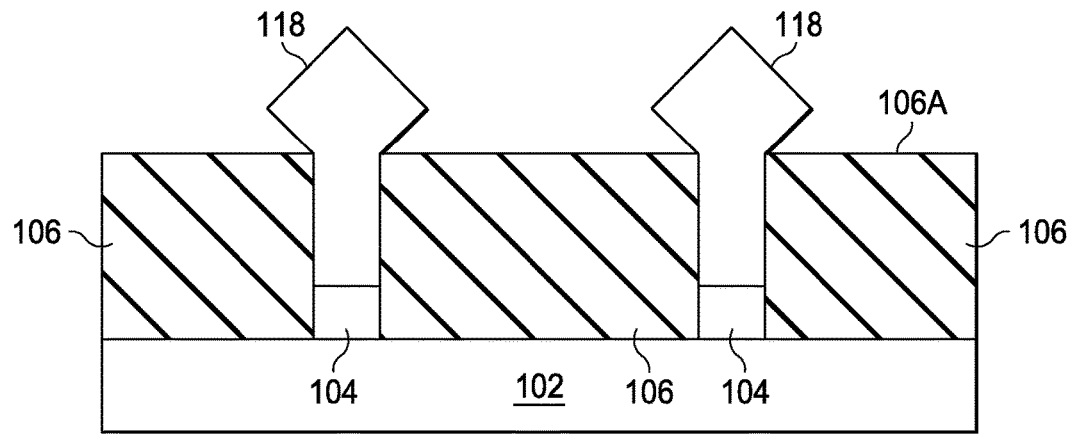

After the recesses 116 are formed, the source/drain regions 118 are formed (step 206) in the recesses 116 as illustrated in FIGS. 4A and 4B. The source/drain regions 118 are formed by epitaxially growing SiGe, Ge, Si, combinations thereof, or the like in the recesses 116. In a PMOS embodiment, the source/drain regions 118 are made of SiGe$_x$ (where x≥0.1) to strain the channel region 110. In an embodiment, the semiconductor fin 108 has a first lattice constant and the source/drain regions 118 have a second lattice constant, the second lattice constant being different the first lattice constant. The epitaxial growth of source/drain regions 118 forms a same crystalline orientation in the semiconductor fins 108 and the source/drain regions 118. The growth of the source/drain regions 118 may be substantially confined by the isolation regions 106. In some embodiments, sidewalls of the source/drain regions 118 are substantially orthogonal to the top surface of the semiconductor substrate 102. In an embodiment, top surfaces of the source/drain regions 118 may be have facets which are non-parallel and non-perpendicular to the top surface of the semiconductor substrate 102. In some embodiments, the top surfaces of the source/drain regions 118 may be above the top surface 106A of the isolation regions 106. The source/drain regions 118 may be doped either through an implanting process to implant appropriate dopants to complement the dopants in the semiconductor fin 108, or else by in-situ doping as the material is grown.

In some embodiments, the source/drain regions 118 have a lightly doped region and a heavily doped region. In this embodiment, gate spacers (not shown) are formed on the dummy gate electrode 114 and before the gate spacers are formed, the source/drain regions 118 is lightly doped. After the gate spacers are formed, the source/drain regions 118 are heavily doped. This forms lightly doped regions and heavily doped regions. The lightly doped regions are primarily underneath the gate spacers while the heavily doped regions are outside of the gate spacers along the semiconductor fin 108.

Although FIG. 4B only illustrates the source/drain regions 118 on one side of the dummy gate electrode 114, the source/drain regions 118 on the opposite side of the dummy gate electrode 114 have a similar structural configuration.

Figure 5A:
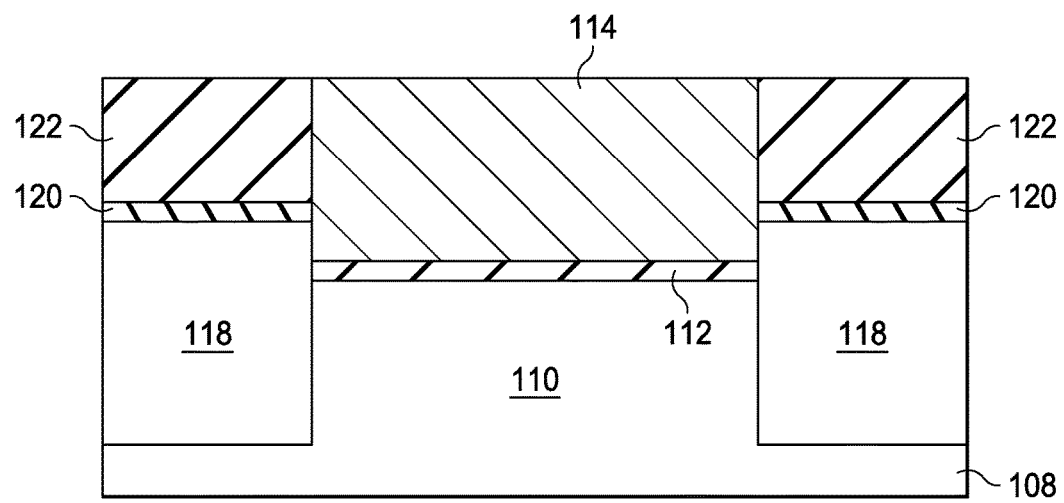
Figure 5B:
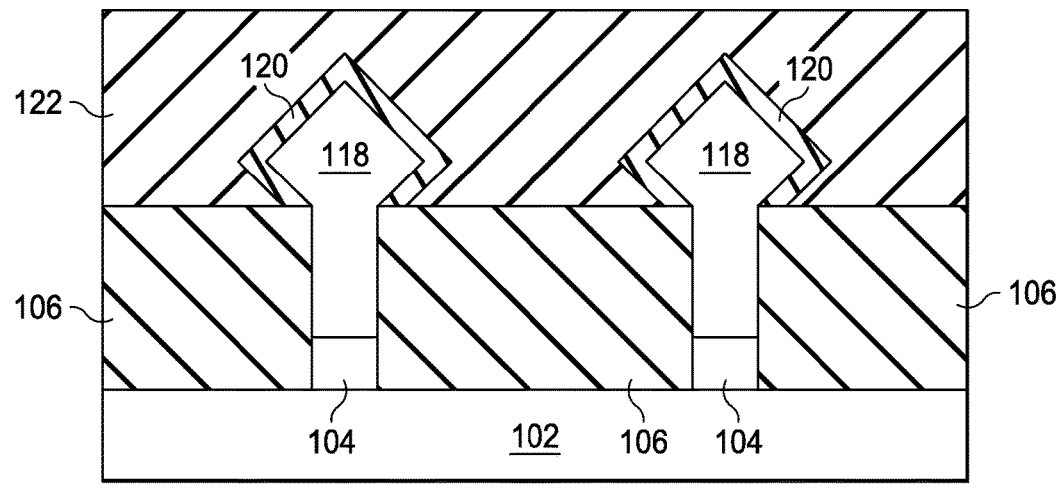

FIGS. 5A and 5B illustrate the formation of a etch stop layer (ESL) 120 over the source/drain regions 118 and an inter-layer dielectric (ILD) 122 (step 208) formed over the semiconductor fins 108, the isolation regions 106, the dummy gate electrode 114, and the source/drain regions 118. The ESL 120 may be conformally deposited over the source/drain regions 118 to protect the source/drain regions 118 during the subsequent formation of contacts through the ILD 122 to the source/drain regions 118. In an embodiment, the ESL 120 is silicon nitride, silicon oxide, the like, or a combination thereof and is formed by plasma-enhanced CVD (PECVD), low-pressure CVD (LPCVD), atomic layer deposition (ALD), the like, or a combination thereof.

The ILD 122 may be formed over the ESL 120 and the dummy gate electrode 114. In an embodiment, the ILD 122 may comprise silicon oxide, silicon nitride, the like, or a combination thereof. The ILD 122 may be formed by CVD, a high density plasma (HDP), the like, or a combination thereof. The ILD 122 may be planarized to be substantially coplanar with a top surface of the dummy gate electrode 114. In an embodiment, the ILD 122 is planarized by using a CMP to remove portions of the ILD 122. In other embodiments, other planarization techniques may be used, such as etching.

Figure 6A:
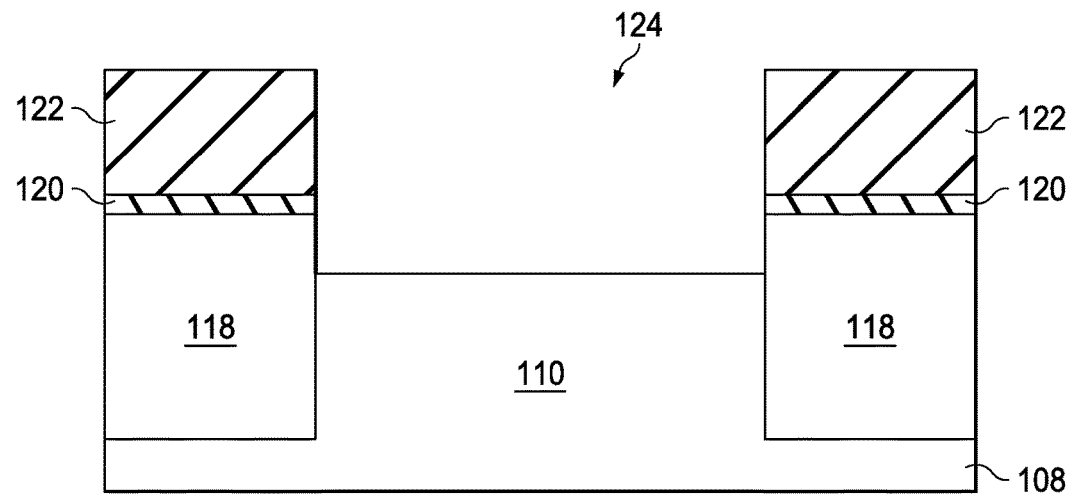
Figure 6B:
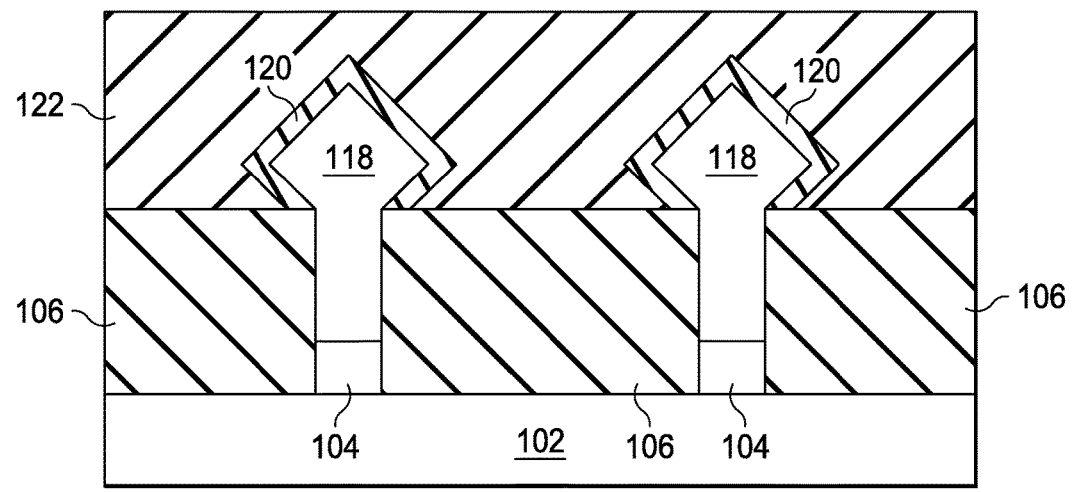

FIGS. 6A and 6B illustrate the removal of dummy gate electrode 114 and the dummy gate dielectric layer 112 (step 210) forming an opening 124 over the channel region 110 in the semiconductor fin 108 between the source/drain regions 118. In an embodiment, the dummy gate electrode 114 is removed by an etch process that is selective to the material of the dummy gate electrode 114. For example, if the dummy gate electrode 114 comprises polysilicon, a dry etch using NF$_3$, SF$_6$, Cl$_2$, HBr, the like, or a combination thereof or a wet etch using NH$_4$OH, tetramethylammonium hydroxide (TMAH), the like, or a combination thereof may be used to remove the dummy gate electrode 114.

Figure 7A:
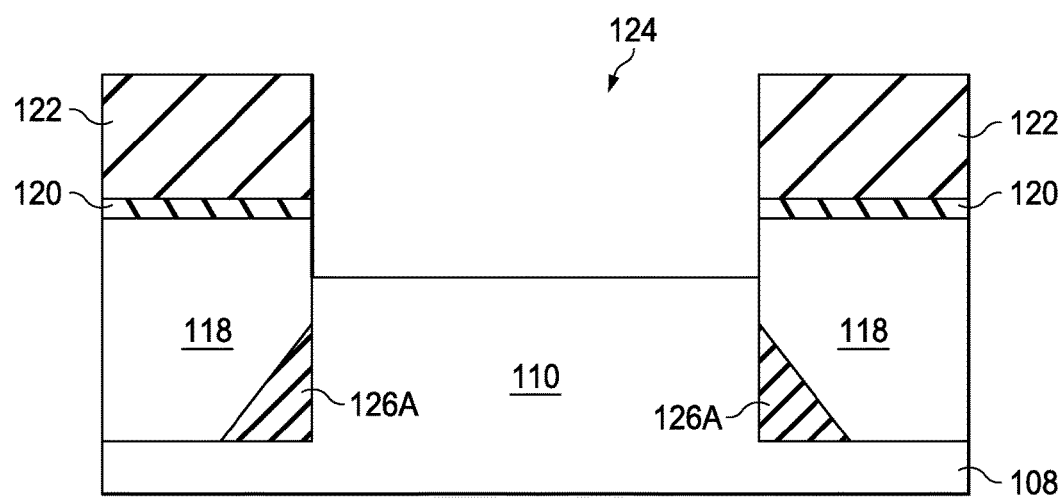
Figure 7B:
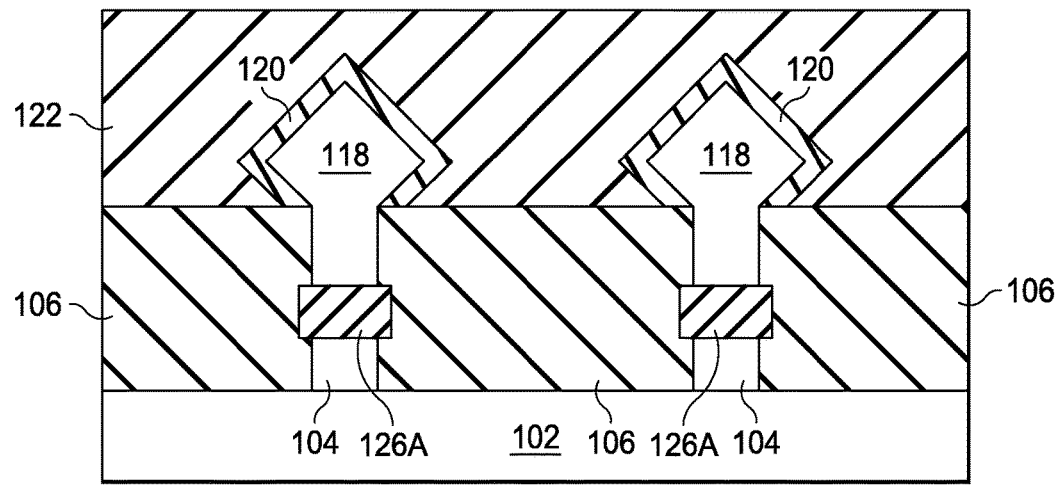

FIGS. 7A and 7B illustrate the formation of buried oxide regions 126A in the source/drain regions 118 (step 212) in accordance with an embodiment. The buried oxide regions 126A are formed by performing an oxidation process to the semiconductor substrate 102. In some embodiments, an optional sacrificial oxide layer (not shown) is formed on the exposed portions of the semiconductor fins 108 over the channel region 110. This sacrificial oxide layer may be a thin film comprising silicon oxide or the like and may be formed by LPCVD, PECVD, the like, or a combination thereof.

In an embodiment, the oxidation process is performed at a temperature from about 400° C. to about 600° C., at a pressure from about 1 atmosphere (atm) to about 20 atm, for a time from about 10 minutes (mins) to about 60 mins, and with H$_2$O as a reaction gas. As illustrated in FIGS. 7A and 7B, the buried oxide regions 126A are formed adjacent an interface with high strain between the source/drain regions 118 and the channel region 110 rather than being formed on the semiconductor fin 108 with no strain or low strain. Also, the oxidation process does not form an oxide region on the upper portions of the interface between the source/drain regions 118 and the channel region 110 because the ESL 120 blocks the reaction gas whereas the reaction gas can penetrate the isolation regions 106. In an embodiment, the buried oxide regions 126A cover only a portion of the bottom of the source/drain regions 118. In some embodiments, the buried oxide regions 126A extend into portions of the isolation regions 106 (see FIG. 7B). In an embodiment, the buried oxide regions 126A are formed of GeO$_x$ or SiGeO$_x$.

The buried oxide regions 126A apply a stronger compressive strain to the channel region 110 than the strained source/drain regions 118 alone. In some embodiments, the buried oxide regions 126A have a different material composition than the other portions of the source/drain regions 118. In an embodiment, the buried oxide regions 126A have a different material composition than the isolation regions 106. The buried oxide regions 126A have a sidewall adjacent the channel region 110 and a bottom surface adjacent the semiconductor fin 108 with the sidewall being substantially perpendicular to the bottom surface of the buried oxide region 126A.

Figure 8A:
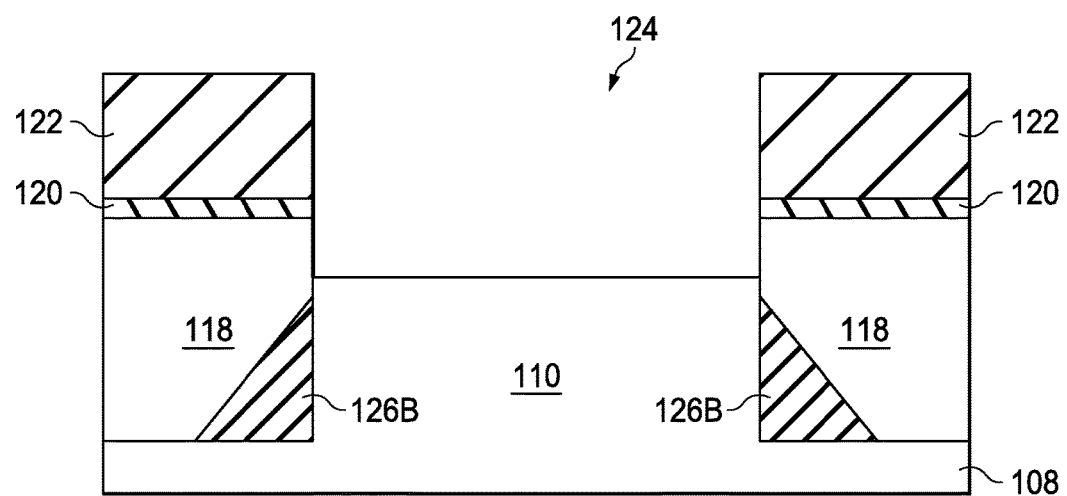
Figure 8B:
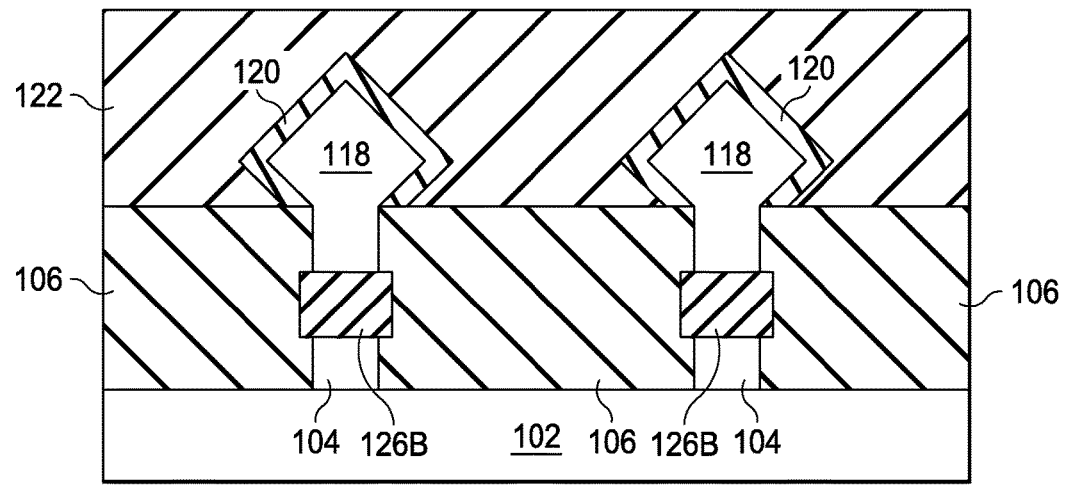

FIGS. 8A and 8B illustrate the formation of a buried oxide regions 126B in the source/drain regions 118 (step 212) in accordance with an embodiment. The buried oxide regions 126B are formed by a similar process as the buried oxide regions 126A described above except that the oxidation process for forming the buried oxide regions 126B is performed for a longer time and/or at a higher temperature than the oxidation process for forming buried oxide regions 126A. As a result of the longer time and/or higher temperature, the buried oxide regions 126B are larger than and apply a stronger compressive strain to the channel region 110 than the buried oxide regions 126A. In some embodiments, the buried oxide regions 126B extend further along the bottom surface of the source/drains 118 and further up the interface between the source/drains 118 and the channel region 110 than the buried oxide regions 126A. In some embodiments, the buried oxide regions 126B extends further in to the isolation regions 106 than the buried oxide regions 126A.

FIGS. 9A and 9B illustrate the formation of a buried oxide regions 126C in the source/drain regions 118 (step 212) in accordance with an embodiment. The buried oxide regions 126C are formed by a similar process as buried oxide regions 126A and 126B described above except that the oxidation process for forming buried oxide regions 126C is performed for a longer time and/or at a higher temperature than the oxidation process for forming buried oxide regions 126B. As a result of the longer time and/or higher temperature, the buried oxide regions 126C are larger than and apply a stronger compressive strain to the channel region 110 than the buried oxide regions 126B. In some embodiments, the buried oxide regions 126C extend further along the bottom surface of the source/drains 118 and further up the interface between the source/drains 118 and the channel region 110 than the buried oxide regions 126B. In an embodiment, the buried oxide regions 126C extend completely across the bottom surface of the source/drain regions 118. In some embodiments, the buried oxide regions 126C extends further in to the isolation regions 106 than the buried oxide regions 126B.

FIGS. 10A and 10B illustrate the formation of gate dielectric layer 128 and the gate electrode 130 in the opening 124. The gate dielectric layer 128 and the gate electrode 130 may be formed of similar materials and by similar processes as dummy gate dielectric layer 112 and dummy gate electrode 114 described above, and the descriptions are not repeated herein.

In an embodiment, the buried oxide region 126C is formed to have a thickness $T_1$ from about 5 nm to about 30 nm. In some embodiments, the buried oxide regions 126C extend a distance $D_1$ into the isolation regions 106 from a sidewall of the semiconductor strip 104 with the distance $D_1$ being from about 1 nm to about 5 nm. In some embodiments, the buried oxide region 126C has a distance $D_2$ between a top surface of the buried oxide region 126C to a top surface of the isolation region 106 with the distance $D_2$ being from about 10 nm to about 30 nm. In an embodiment, the buried oxide region 126C extends the distance $D_1$ into the channel region 110. If the oxidation process if performed too long and/or at too high of a temperature, buried oxide regions 126C will have an increased thickness $T_1$ which may impact the resistance of the source/drain regions 118.

Figure 12:
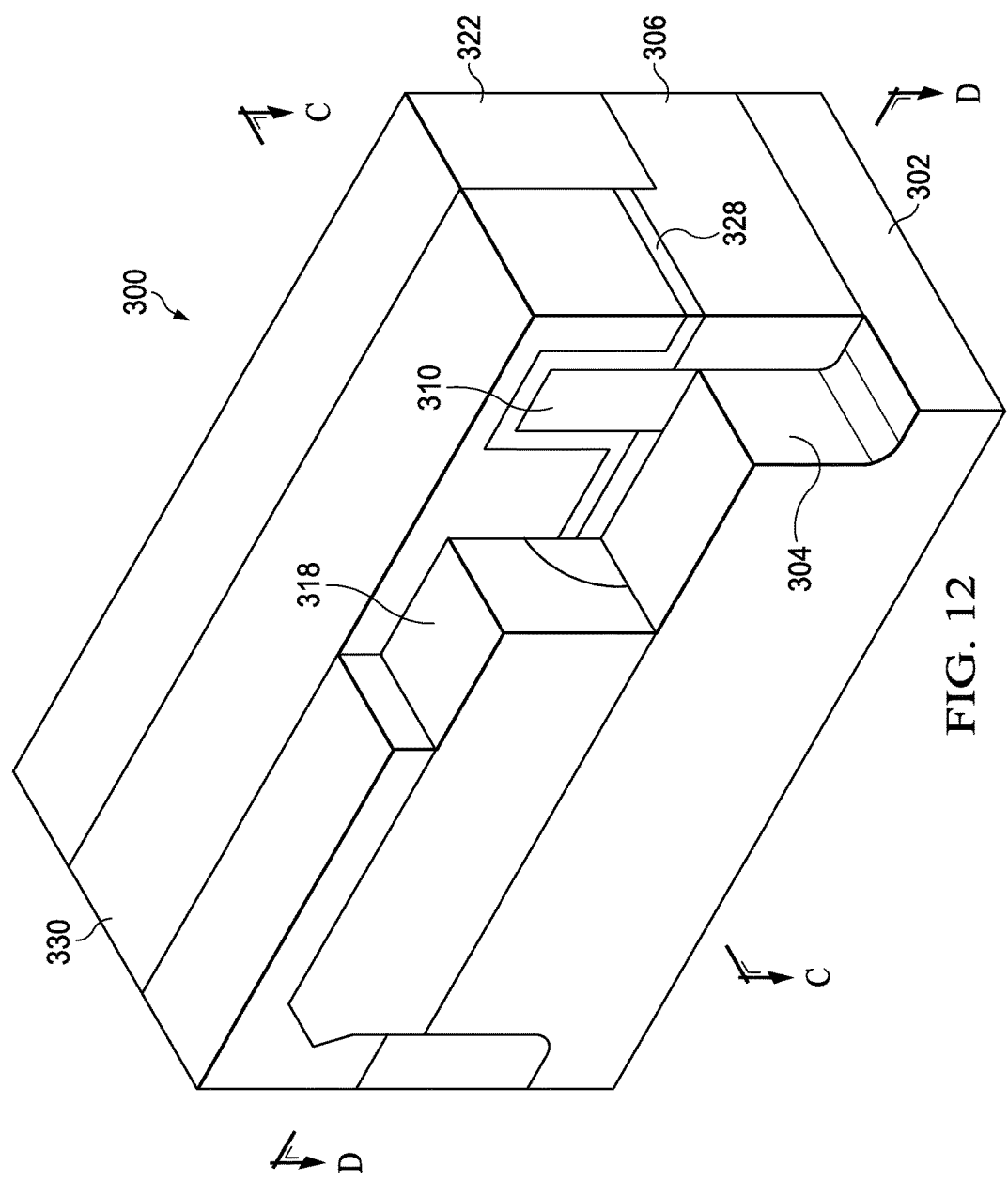
FIG. 12 illustrates a FinFET in a three-dimensional view in accordance with an embodiment.

FIG. 12 illustrates a FinFET 300 in a three-dimensional view. The FinFET 300 is similar to the FinFET 100 described above except that the semiconductor fins 308 are formed on a raised portion 304 (also referred to as a crown portion) of the substrate 302. In this embodiment, a continuous source/drain region 118 is coupled to each of the semiconductor fins 308 and is adjacent each of the channel regions 310 to form a single source/drain region 318 on each side of the channel region 110. Details regarding this embodiment that are similar to those for the previously described embodiment will not be repeated herein.

The FinFET 300 includes isolation regions 306 adjacent and on the raised portions 304 and between the channel regions 110 of the semiconductor fins 308. A gate dielectric 328 is along sidewalls and over a top surface of the semiconductor fins 308, and a gate electrode 330 is over the gate dielectric 328. Source/drain regions 318 are disposed along opposite sides of the channel regions 110. An ILD 322 is over the semiconductor fins 308 and the source/drains 318 adjacent the gate electrode 330. In some embodiments an ESL 320 is formed on the source/drain regions 318 and the ILD 322 is formed on the ESL 320 (see FIGS. 13A and 13B). FIG. 12 further illustrates reference cross-sections that are used in FIGS. 13A and 13B. Cross-section C-C is along a longitudinal axis of a semiconductor fin 308 and the raised portion 304 and in a direction of, for example, a current flow between the source/drain regions 318. Cross-section D-D is perpendicular to cross-section C-C and is across source/drains 318, the semiconductor fins 308, the raised portion 304, the isolation regions 306, and the ILD 322.

Figure 13A:
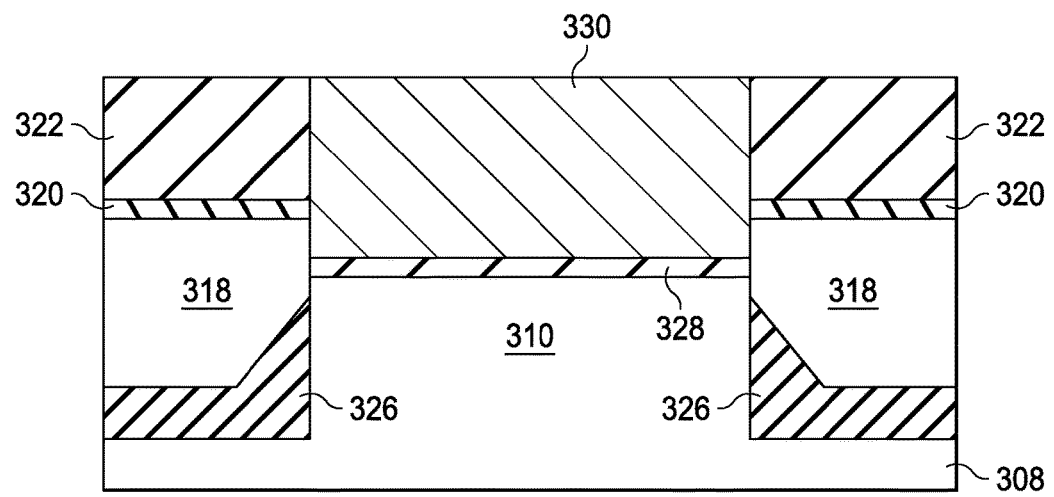
FIGS. 13A and 13B are cross-sectional views of the FinFET in FIG. 12 in accordance with an embodiment.
Figure 13B:
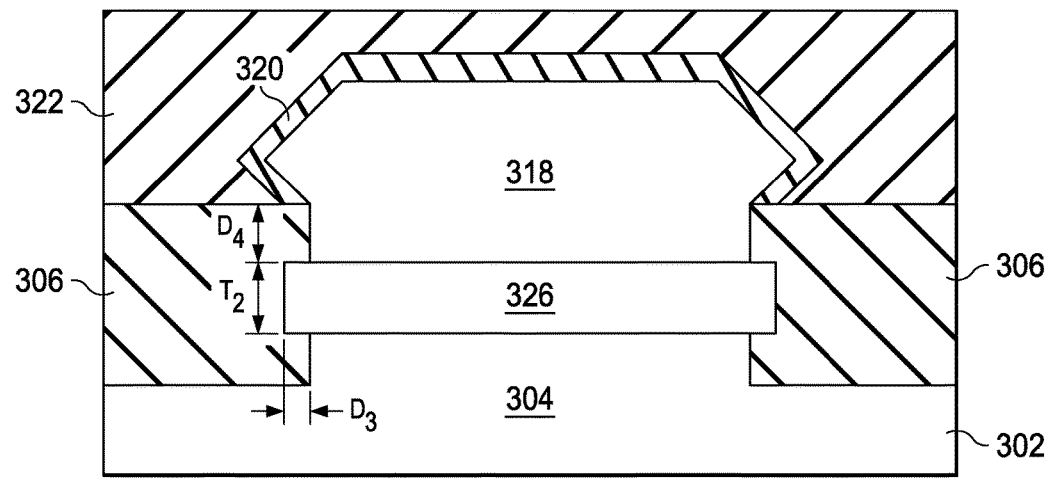

FIGS. 13A and 13B illustrate an intermediate stage of manufacturing the FinFET 300 similar to the stage described above in FIGS. 10A and 10B. The buried oxide regions 326 are formed by a similar process as buried oxide regions 126A, 126B, and 126C described above and the descriptions will not be repeated herein. In some embodiments, the buried oxide regions 326 extend completely across the bottom of the source/drain regions 318. In other embodiments, the buried oxide regions 326 extend partially across the bottom of the source/drain regions 318 similar to buried oxide regions 126A and 126B described above.

In an embodiment, the buried oxide region 326 is formed to have a thickness $T_2$ from about 5 nm to about 30 nm. In some embodiments, the buried oxide regions 326 extend a distance $D_3$ into the isolation regions 306 from a sidewall of the raised portion 304 with the distance $D_3$ being from about 1 nm to about 5 nm. In some embodiments, the buried oxide region 326 has a distance $D_4$ between a top surface of the buried oxide region 326 to a top surface of the isolation region 306 with the distance $D_4$ being from about 10 nm to about 30 nm. In an embodiment, the buried oxide region 326 extends the distance $D_3$ into the channel region 310.

The FinFETs 100 and 300 may undergo further processing such as formation of contacts and vias, interconnect layers, passivation layers, and other processes to configure the FinFETs 100 and 300 for specific embodiments. Thus, by having the buried oxide regions formed in the source/drain regions, a stronger compressive strain may be applied to the channel region to improve the performance of the FinFETs 100 and/or 300. Also, by forming the buried oxide regions after the semiconductor fins have been formed, the process for forming the semiconductor fins does not need to be altered.

An embodiment is a semiconductor device including a first semiconductor fin extending above a substrate, the first semiconductor fin having a first lattice constant, an isolation region surrounding the first semiconductor fin, and a first source/drain region in the first semiconductor fin, the first source/drain having a second lattice constant different from the first lattice constant. The semiconductor device also includes an etch stop layer over and in contact with the first source/drain region, which is configured to prevent a formation of oxide on the top surface of the source/drain region. The semiconductor device further includes a first oxide region along a bottom surface of the first source/drain region, the first oxide region extending into the isolation region.

Another embodiment is a fin field-effect transistor (FinFET) device including a semiconductor fin extending above a substrate, the semiconductor fin having a first lattice constant, an isolation region surrounding the semiconductor fin, and a first source/drain region in the semiconductor fin, the first source/drain having a second lattice constant different from the first lattice constant. The FinFET device further includes a channel region in the semiconductor fin adjacent the first source/drain region, and a first oxide region adjoining a first interface between the first source/drain region and the channel region, the first oxide region extending into the isolation region beyond a sidewall profile of the fin.

A further embodiment is a semiconductor device including a first semiconductor fin extending above a substrate. The first semiconductor fin includes a channel region having a first lattice constant and a first source/drain region having a second lattice constant. The second lattice constant is different from the first lattice constant. The device includes an isolation region surrounding the first semiconductor fin and a first source/drain epitaxy in the first source/drain region. The device further includes a first oxide region at an interface of the channel region and the first source/drain region. The oxide region extends into the first source/drain region at a first height at the interface and decreasing in height as it extends into the first source/drain region.

method for forming a fin field-effect transistor (FinFET) device, the method including forming a first semiconductor fin extending above a substrate, the first semiconductor fin having a first lattice constant, forming an isolation region surrounding the semiconductor fin, and forming a first source/drain region in the first semiconductor fin, the first source/drain having a second lattice constant different from the first lattice constant. The method further includes performing an oxidation process to the substrate to form a first oxide region in the first source/drain region, the first oxide region being along a bottom surface of the first source/drain region and extending into the isolation region.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
    a first semiconductor fin extending above a substrate, the first semiconductor fin having a first lattice constant;
    an isolation region surrounding the first semiconductor fin;
    a first source/drain region in the first semiconductor fin, the first source/drain region having a second lattice constant different from the first lattice constant;
    a channel region in the first semiconductor fin, the channel region abutting the first source/drain region; and
    a first oxide region along a bottom surface of the first source/drain region, the first oxide region extending into the isolation region, wherein a concentration of oxide in the first oxide region decreases in a direction from the channel region toward the first source/drain region.

2. The semiconductor device of claim 1, wherein the first semiconductor fin comprises a first material and the first source/drain region comprises a second material different than the first material, wherein the first oxide region substantially comprises an oxide of the second material, wherein the semiconductor device further comprises:
    a second source/drain region in the first semiconductor fin, the second source/drain region having the second lattice constant, the second source/drain region comprising the second material;
    a second oxide region along a bottom surface of the second source/drain region, the second oxide region extending into the isolation region, the second oxide region substantially comprising the oxide of the second material; and
    wherein the channel region of the first semiconductor fin is interposed between the first and second source/drain regions, the channel region having the first lattice constant.

3. The semiconductor device of claim 2, wherein the first and second oxide regions extend into the isolation region by a first distance, and wherein the first and second oxide regions extend into the channel region by the first distance.

4. The semiconductor device of claim 2 further comprising:
    a gate dielectric layer over the channel region; and
    a gate on the gate dielectric layer, the gate being interposed between the first and second source/drain regions.

5. The semiconductor device of claim 1, wherein the first source/drain region has a top surface comprising more than one facet, at least one of the more than one facets being non-parallel and non-perpendicular to a top surface of the substrate.

6. The semiconductor device of claim 1 further comprising:
    a second semiconductor fin extending above the substrate, the second semiconductor fin being parallel to the first semiconductor fin and having the first lattice constant, the isolation region surrounding the second semiconductor fin;
    a third source/drain region in the second semiconductor fin, the third source/drain region having the second lattice constant; and
    a third oxide region along a bottom surface of the third source/drain region, the third oxide region extending into the isolation region.

7. The semiconductor device of claim 6, further comprising:
    a raised portion of the substrate, the first and second semiconductor fins extending from the raised portion, wherein the first and third source/drain regions are a continuous source/drain region, and wherein the first and third oxide regions are a continuous oxide region.

8. The semiconductor device of claim 1, further comprising a gate structure over the channel region, wherein a first thickness of the first oxide region laterally adjacent the gate structure is greater than a second thickness of the first oxide region further from the gate structure, wherein the first thickness and the second thickness are measured from a first surface of the first oxide region to a second surface of the first oxide region opposite the first surface, wherein the first surface has an interface with the first semiconductor fin.

9. The semiconductor device of claim 8, wherein the first oxide region extends completely across the bottom surface of the first source/drain region.

10. A fin field-effect transistor (FinFET) device comprising:
- a semiconductor fin comprising a first material extending above a substrate, the semiconductor fin having a first lattice constant;
- an isolation region surrounding the semiconductor fin;
- a first source/drain region in the semiconductor fin comprising a second material, the first source/drain region having a second lattice constant different from the first lattice constant;
- a channel region in the semiconductor fin adjacent the first source/drain region; and
- a first oxide region adjoining a first interface between the first source/drain region and the channel region, the first oxide region extending into the isolation region beyond a sidewall profile of the semiconductor fin, the first oxide region comprising an oxide of the second material at a first concentration adjacent the channel region and an oxide of the second material at a second concentration further from the channel region than the first concentration, wherein the second concentration is less than the first concentration.

11. The FinFET device of claim 10, wherein the first oxide region has a different material composition than the isolation region.

12. The FinFET device of claim 10, wherein the first oxide region adjoins a second interface between the first source/drain region and the semiconductor fin, the second interface being perpendicular to the first interface, wherein a portion of the second interface is substantially free of the oxide of the second material.

13. The FinFET device of claim 10, wherein a top surface of the first oxide region is lower than a top surface of the isolation region.

14. The FinFET device of claim 10, wherein the first source/drain region comprises Ge or SiGe.

15. The FinFET device of claim 10, wherein the first oxide region comprises $GeO_x$ or $SiGeO_x$.

16. The FinFET device of claim 10, wherein the first oxide region extends into the channel region.

17. The FinFET device of claim 10 further comprising:
- a second source/drain region in the semiconductor fin, the second source/drain region being on an opposite side of the channel region from the first source/drain region;
- a second oxide region adjoining a third interface between the second source/drain region and the channel region, the second oxide region extending into the isolation region;
- an etch stop layer (ESL) on the first and second source/drain regions;
- an inter-layer dielectric (ILD) on the ESL;
- a gate dielectric layer over the channel region; and
- a gate on the gate dielectric layer, the gate being interposed between the first and second source/drain regions.

18. A semiconductor device comprising:
- a first semiconductor fin extending above a substrate, the first semiconductor fin comprising a channel region having a first lattice constant and a first source/drain region having a second lattice constant, different from the first lattice constant;
- a gate structure on a top and sidewalls of the channel region of the first semiconductor fin;
- an isolation region surrounding the first semiconductor fin; and
- a first oxide region interposed between the channel region and the first source/drain region and interposed between the first source/drain region and the substrate, the first oxide region being a first thickness at a first interface between the first oxide region and the channel region, the first oxide region being a second thickness at a second interface between the first oxide region and the substrate, wherein the first thickness is greater than the second thickness, wherein the first oxide region tapers from the first thickness to the second thickness.

19. The semiconductor device of claim 18, wherein the first oxide region extends into the isolation region by a first distance.

20. The semiconductor device of claim 19, wherein the first oxide region extends into the channel region by the first distance.

* * * * *